(12) United States Patent
Yang et al.

(10) Patent No.: US 11,186,770 B2
(45) Date of Patent: Nov. 30, 2021

(54) II-VI BASED NON-CD QUANTUM DOTS, MANUFACTURING METHOD THEREOF AND QLED USING THE SAME

(71) Applicant: Hongik University Industry-Academia Cooperation Foundation, Seoul (KR)

(72) Inventors: Hee-Sun Yang, Seoul (KR); Eun-Pyo Jang, Gwangju (KR)

(73) Assignee: Hongik University Industry-Academia Cooperation Foundation, Seoul (KR)

(*) Notice: Subject to any disclaimer, the term of this patent is extended or adjusted under 35 U.S.C. 154(b) by 103 days.

(21) Appl. No.: 16/555,718

(22) Filed: Aug. 29, 2019

(65) Prior Publication Data

US 2020/0362240 A1 Nov. 19, 2020

(30) Foreign Application Priority Data

May 16, 2019 (KR) .................. 10-2019-0057625

(51) Int. Cl.
*H01L 51/50* (2006.01)
*C09K 11/56* (2006.01)
*C09K 11/88* (2006.01)
*H01L 51/00* (2006.01)

(52) U.S. Cl.
CPC .......... *C09K 11/883* (2013.01); *C09K 11/565* (2013.01); *C09K 11/567* (2013.01); *H01L 51/502* (2013.01); *H01L 51/5056* (2013.01); *H01L 51/5072* (2013.01); *H01L 51/5088* (2013.01); *H01L 51/0035* (2013.01); *H01L 51/0037* (2013.01); *H01L 51/0042* (2013.01); *H01L 2251/5369* (2013.01)

(58) Field of Classification Search
CPC .............................. H01L 51/502; H01L 33/28
See application file for complete search history.

(56) References Cited

U.S. PATENT DOCUMENTS

2019/0276737 A1* 9/2019 Won .................. C09K 11/02
2019/0280231 A1* 9/2019 Kim ................... C09K 11/02

FOREIGN PATENT DOCUMENTS

KR 10-2018-0013801 A 2/2018

OTHER PUBLICATIONS

Asano, H., et al., "Synthesis of colloidal Zn(Te,Se) Alloy quantum dots", Materials Research Express 2017, 10 pages, vol. 4, Publisher: IOP Publishing Ltd.

(Continued)

*Primary Examiner* — Moazzam Hossain
(74) *Attorney, Agent, or Firm* — Wolter Van Dyke Davis, PLLC; Eugene J. Molinelli; Michael Byrne

(57) ABSTRACT

The present disclosure provides II-VI based non-Cd visible light emitting quantum dots (QDs) and a manufacturing method thereof to solve the problems with broad full width at half maximum (FWHM) and low quantum efficiency. The present disclosure further provides a QD light emitting diode (QLED) using the II-VI based non-Cd visible light emitting QDs. The QDs according to the present disclosure include a II-VI based ternary ZnSeTe core, wherein a Se:Te ratio in the ZnSeTe core is 1:10 to 100:1. According to the present disclosure, it is possible to provide QDs that emit visible light ranging from red to blue by adjusting the Se:Te ratio in the II-VI based ternary ZnSeTe core.

13 Claims, 13 Drawing Sheets

(56) References Cited

OTHER PUBLICATIONS

Asano, H., et al., "Colloidal Zn(Te,Se)/ZnS Core/Shell Quantum Dots Exhibiting Narrow-Band and Green Photoluminescence", ACS Omega 2018, pp. 6703-6709, vol. 3.
Kamata, A., et al., "Growth and doping characteristics of ZnSeTe epilayers by MOCVD", Journal of Crystal Growth 1997, pp. 518-522, vol. 170.
Lesnyak, V., et al., "One-step aqueous synthesis of blue-emitting glutathione-capped $ZnSe_{1-x}Te_x$ alloyed nanocrystals", Chemical Communications 2010, pp. 886-888, vol. 46.
Li, C., et al., "Synthesis of Cd-free water-soluble $ZnSe_{1-x}Te_x$ nanocrystals with high luminescence in the blue region" Journal of Colloid and Interface Science 2008, pp. 468-476, vol. 321.
Lin, Q., et al., "Cadmium-free quantum dots based violet light-emitting diodes: High-efficiency and brightness via optimization of organic hole transport layers", Organic Electronics 2015, pp. 178-183, vol. 25.
Su, C., et al., "Optical characterization of bulk ZnSeTe solid solutions", Journal of Applied Physics 2000, pp. 5148-5152, vol. 88, No. 9.
Wang, A., et al., "Bright, efficient, and color-stable violet ZnSe-based quantum dot light-emitting diodes" Nanoscale 7, 2015, pp. 2951-2959, vol. 7.
Wang, C.H., et al., "Cadmium-Free InP/ZnSeS/ZnS Heterostructure-Based Quantum Dot Light-Emitting Diodes with a ZnMgO Electron Transport Layer and a Brightness of Over 10 000 cd m-2," Nano Micro Small 2017, pp. 1-7, DOI: 10.1002/smll.201603962.

\* cited by examiner

II-VI BASED NON-CD QUANTUM DOTS, MANUFACTURING METHOD THEREOF AND QLED USING THE SAME

TECHNICAL FIELD

The present disclosure relates to non-Cd quantum dots (QDs), a manufacturing method thereof and a device using the same, and more particularly, to II-VI based visible light emitting QDs, a manufacturing method thereof and a QD light emitting diode (QLED) using the same.

The present application claims the benefit of Korean Patent Application No. 10-2019-0057625 filed on May 16, 2019 with the Korean Intellectual Property Office, the disclosure of which is incorporated herein by reference in its entirety.

BACKGROUND ART

A colloidal semiconductor nanocrystal called a quantum dot (QD) emits light as an electron in an unstable state moves from the conduction band to the valence band, and as QDs are smaller in size, they emit shorter wavelength light. This is unique electrical and optical properties that are different from those of the existing semiconductor material, and QDs are easy to modify the fluorescent emission wavelength through size adjustment or alloying/doping introduction. In addition, with the continuous development of synthesis methods, fluorescent emission of QDs is satisfactorily efficient in terms of practical device applications. Thus, QDs are regarded as an active material that can replace rare earth element-doped bulk phosphor and fluorescent/phosphorescent polymer in the manufacture of LEDs.

In the application of QDs to displays, there are a color-conversion process and an electroluminescence (EL) process. Currently, color-conversion process based displays are put into commercialization, but QD based displays ultimately pursue the electroluminescence process. The electroluminescence process based QD light-emitting diodes (QLEDs) have a similar structure to the existing organic light-emitting diodes (OLEDs), and use QDs rather than organics in the light emitting layer. OLEDs produce monochromatic light such as white, red and blue according to the device type, but have a limitation in the splendid presentation of light of many colors due to the broad full width at half maximum (FWHM) characteristics of organic light emitting materials. In contrast, QLEDs can produce desired natural colors by adjusting the size of QDs, and their narrow FWHM characteristics provide good color reproducibility and luminance is as good as that of OLEDs, so much attention is paid to QLEDs as a next-generation light source material that can overcome the drawbacks of OLEDs.

To produce full natural color QLEDs, three primary colors of light, red, green and blue emitting QDs are necessary. In the case of II-VI based QDs containing Cd, red, green and blue emitting QD and electroluminescent LEDs with high quantum efficiency (quantum yield; QY) and narrow FWHM have been developed, but they contain Cd harmful to humans, and thus their use is restricted.

Because they are non-Cd and do not use heavy metal, III-V based InP QDs attract attention as light emitting materials for eco-friendly displays and lighting applications, and there have been studies and reports about red and green electroluminescent devices. However, to emit blue (450 nm) light, QDs need to have 2.75 eV of relatively high energy. Among non-Cd composition candidates, III-V based InP QDs have the bulk band gap of relatively low energy of 1.35 eV, and thus, to emit blue light of high energy, InP QDs should be very small in size or disposed at a very strong photon confining region. However, it is difficult to develop synthesis methods for controlling it. A few types of InP blue emitting QDs have been proposed, but emission wavelength is <480 nm, and quantum efficiency of blue InP QDs is 40% or less, which makes commercialization difficult.

Among non-Cd composition candidates, II-VI based ZnSe QDs have the bulk band gap (2.69 eV) that is close to 2.75 eV (blue). For more suitable blue wavelength (440-450 nm), very large ZnSe QDs are necessary, but it is difficult to develop synthesis methods for size control. By this reason, most of ZnSe QDs developed to date are reported at the mid-wavelength between violet (420 nm) and blue (440 nm).

Studies of ZnSe QDs having the emission wavelength of visible light region have reported green (545 nm), red (610 nm) emission wavelengths through doping or combination of materials such as Mn and Cu, and the emission properties of quantum efficiency <70% and FWHM >50 nm need improvement for commercialization.

A II-VI based ternary Zn—Se—Te composition formed by alloying ZnSe semiconductor and ZnTe (2.3 eV) semiconductor having a relatively small band gap will adjust the band gap. However, it is necessary to improve the broad FWHM and low quantum efficiency.

DISCLOSURE

Technical Problem

The present disclosure is directed to providing II-VI based non-Cd visible light emitting quantum dots (QDs) and a manufacturing method thereof to solve the problems with broad full width at half maximum (FWHM) and low quantum efficiency.

The present disclosure is further directed to providing a QD light emitting diode (QLED) using the II-VI based non-Cd visible light emitting QDs.

Technical Solution

To solve the above-described problem, quantum dots (QDs) according to the present disclosure include a II-VI based ternary ZnSeTe core, wherein a Se:Te ratio in the ZnSeTe core is 1:10 to 100:1.

The Se:Te ratio in the ZnSeTe core may be 1:10 to 1:1. The QDs may emit red light.

The Se:Te ratio in the ZnSeTe core may be 1:1 to 10:1. The QDs may emit green light.

The Se:Te ratio in the ZnSeTe core may be 10:1 to 100:1. The QDs may emit blue light.

The QDs according to the present disclosure may further include at least two shells, wherein each of the at least two shells has a composition of a combination of a cation selected from Zn, Mg and their combination and an anion selected from S, Se and their combination.

The at least two shells may be a triple-shell including an inner shell surrounding the core, an intermediate shell surrounding the inner shell and an outermost shell surrounding the intermediate shell, or a quadruple-shell in which at least one of the inner shell, the intermediate shell and the outermost shell is double, the triple-shell may be ZnSe/ZnSe$_x$S$_{1-x}$ (0<x<1)/ZnS or ZnSe/ZnSe$_x$S$_{1-x}$(0<x<1)/MgS, and the quadruple-shell may be ZnSe/ZnSe$_x$S$_{1-x}$(0<x<1)/ZnS/ZmS or ZnSe/ZnSe$_x$S$_{1-x}$(0<x<1)/ZnS/MgS.

The shells may be formed with the gradually increasing band gap from the inner one toward the outer one. For example, the at least two shells may be ZnSe/ZnS/MgS, ZnMgSe/ZnS/MgS, ZnMgSeS/ZnMgS/MgS.

A method for manufacturing QDs according to the present disclosure includes reacting a Zn precursor, a Se precursor and a Te precursor in a solution, wherein the QDs include a II-VI based ternary ZnSeTe core, and a Se:Te ratio in the ZnSeTe core is 1:10 to 100:1.

Particularly, reacting the Zn precursor, the Se precursor and the Te precursor preferably includes heating a blend solution of a Zn precursor and a solvent, injecting a Se stock solution including a Se precursor into the blend solution, and injecting a Te stock solution including a Te precursor into the blend solution.

The Se stock solution may include the Se precursor and at least one of diphenylphosphine (DPP), trioctylphosphine (TOP), tributylphosphine (TBP) and tri-phenylphosphine (TPP).

The Te stock solution may include the Te precursor and at least one of DPP, TOP, TBP and TPP.

The method for manufacturing QDs according to the present disclosure may further include forming at least two shells on the ZnSeTe core, wherein each of the at least two shells has a composition of a combination of a cation selected from Zn, Mg and their combination and an anion selected from S, Se and their combination.

Preferably, forming the at least two shells on the ZnSeTe core includes continuously injecting the shell forming materials into the solution in which the reaction of the Zn precursor, the Se precursor and the Te precursor occurred to form a continuous shell.

The present disclosure proposes a QD light emitting diode (QLED) including the QDs. The QLED includes a hole transport layer, a QD light emitting layer and an electron transport layer, wherein the QD light emitting layer includes the QDs according to the present disclosure.

The QLED may further include an anode, a hole injection layer and a cathode, wherein the hole transport layer and the hole injection layer are any one selected from poly(ethyl-enedioxythiophene):polystyrene sulphonate (PEDOT:PSS), poly[(9, 9-dioctyl-fluorenyl-2, 7-diyl)-co-(4, 4'-(N-(p-butylphenyl))diphenylamine)] (TFB), poly(9-vinlycarbazole) (PVK), N, N, N, N', N'-tetrakis(4-methoxyphenyl)-benzidine (TPD), poly-TPD, 4, 4', 4"-tris(N-carbazolyl)-triphenylamine (TCTA), N, N'-bis(naphthalen-1-yl)-N, N'bis(phenyl)-9, 9-spiro-bifluorene(spiro-NPB), dipyrazino [2, 3-f:2', 3'-h]quinoxaline-2, 3, 6, 7, 10, 11-hexacarbonitrile (HATCN), 1, 1-bis[(di-4-tolylamino)phenylcyclohexane (TAPC), p-type metal oxide and their combination.

In a preferred example, the electron transport layer includes metal oxide nanoparticles, and the metal oxide nanoparticles include Zn containing Mg oxide nanoparticles of $Zn_{1-x}Mg_x(0 \leq x \leq 0.5)$ composition, and a Mg ion surface treatment layer formed on the nanoparticles surface.

After forming the at least two shells, the method may further include treatment using a Zn stock solution for QD surface defect removal and additional ligand adsorption reaction.

Advantageous Effects

The present disclosure provides quantum dots (QDs) that emit visible light ranging from red to blue by adjusting the Se:Te ratio in the II-VI based ternary ZnSeTe core. According to the present disclosure, it is possible to achieve desired visible light emission wavelengths by changing the band gap of the QDs through the adjustment of the composition and size of semiconductor. According to the present disclosure, it is possible to provide human- and eco-friendly QDs because of emitting blue, green and red light through the non-Cd II-VI based ZnSeTe core.

Furthermore, the present disclosure can manufacture QDs having high quantum efficiency of 70% or more and narrow full width at half maximum (FWHM) of 30-35 nm through an additional at least two shell process.

It is possible to manufacture QD light emitting diodes (QLEDs) using the QDs. The QLEDs exhibit high luminance and quantum efficiency.

MODE FOR DISCLOSURE

Hereinafter, preferred embodiments of the present disclosure will be described in detail with reference to the accompanying drawings. However, the present disclosure is not limited to the embodiments disclosed below and may be embodied in many different forms, and rather, these embodiments are provided to render the disclosure of the present disclosure complete and help those having ordinary skill in the art to fully understand the scope of the present disclosure.

Figure 1:
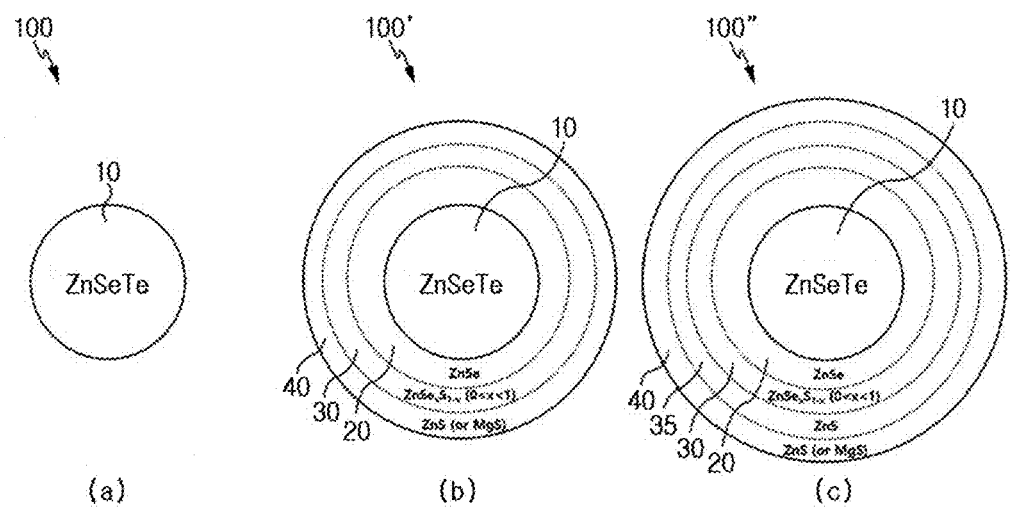
FIG. 1 is a schematic diagram of a quantum dot (QD) according to the present disclosure.

FIG. 1 is a schematic diagram of a quantum dot (QD) according to the present disclosure.

(a) of FIG. 1 shows a QD 100 having a core 10 alone.

The core 10 is a II-VI based ternary ZnSeTe core. Here, a Se:Te ratio is 1:10 to 100:1. A desired target wavelength may be presented by adjusting the Se:Te ratio within the above-described range. QDs have different sizes and shapes depending on their manufacturing methods, and even QDs of the same composition have different band gaps, and taking this into consideration, the Se:Te ratio of the QD of the present disclosure should be understood.

The Se:Te ratio in the ZnSeTe core may be 1:10 to 1:1. The QD can emit red light.

The Se:Te ratio in the ZnSeTe core may be 1:1 to 10:1. The QD can emit green light.

The Se:Te ratio in the ZnSeTe core may be 10:1 to 100:1. The QD can emit blue light.

As described above, the present disclosure provides QDs that emit visible light ranging from red to blue by adjusting the Se:Te ratio in the II-VI based ternary ZnSeTe core. According to the present disclosure, it is possible to achieve desired visible light emission wavelengths by changing the band gap of the QDs through the adjustment of the composition and size of semiconductor. According to the present disclosure, it is possible to provide human- and eco-friendly QDs because of emitting blue, green and red light through the non-Cd II-VI based ZnSeTe core.

In addition to the core 10, the QD according to the present disclosure may further include at least two shells. Each of the at least two shells may have a composition of a combination of a cation selected from Zn, Mg and their combination and an anion selected from S, Se and their combination.

The shells may be formed with the gradually increasing band gap from the inner one toward the outer one. For example, the at least two shells may be ZnSe/ZnS/MgS, ZnMgSe/ZnS/MgS, ZnMgSeS/ZnMgS/MgS.

The at least two shells may be a triple-shell including an inner shell surrounding the core, an intermediate shell surrounding the inner shell and an outermost shell surrounding the intermediate shell, or a quadruple-shell in which any one of the inner shell, the intermediate shell and the outermost shell is double, the triple-shell may be ZnSe/ZnSe$_x$S$_{1-x}$ (0<x<1)/ZnS or ZnSe/ZnSe$_x$S$_{1-x}$(0<x<1)/MgS, and the quadruple-shell may be ZnSe/ZnSe$_x$S$_{1-x}$(0<x<1)/ZnS/ZnS or ZnSe/ZnSe$_x$S$_{1-x}$(0<x<1)/ZnS/MgS.

(b) of FIG. 1 shows a QD 100' having a core 10 and a triple-shell. (c) of FIG. 1 shows a QD 100" having a core 10 and a quadruple-shell.

First, referring to (b) of FIG. 1, the QD 100' includes a II-VI based ternary ZnSeTe core 10, an inner shell 20, an intermediate shell 30 and an outermost shell 40. The inner shell 20, the intermediate shell 30 and the outermost shell 40 form a continuous shell. The inner shell 20/the intermediate shell 30/the outermost shell 40 is ZnSe/ZnSe$_x$S$_{1-x}$(0<x<1)/ZnS or ZnSe/ZnSe$_x$S$_{1-x}$(0<x<1)/MgS.

In the case of the quadruple-shell, it can be seen that one of the inner shell 20, the intermediate shell 30 and the outermost shell 40 shown in (b) of FIG. 1 is double. The double shell encompasses different compositions, as well as the same composition, but different precursor types, formation taking place twice, and different formation methods.

Referring to (c) of FIG. 1, the QD 100" includes a II-VI based ternary ZnSeTe core 10, an inner shell 20, intermediate shells 30, 35 and an outermost shell 40. The inner shell 20/the intermediate shell 30/the intermediate shell 35/the outermost shell 40 is ZnSe/ZnSe$_x$S$_{1-x}$(0<x<1)/ZnS/ZnS or ZnSe/ZnSe$_x$S$_{1-x}$(0<x<1)/ZnS/MgS.

Meanwhile, although the triple-shell and the quadruple-shell are taken as examples, a double-shell and shells of more layers than the quadruple-shell may be included. The at least two shells are a multishell. The multishell increases the quantum efficiency of the core 10 and narrows the full width at half maximum (FWHM). It is possible to produce QDs with high quantum efficiency of 70% or more and narrow FWHM of 30-35 nm through an additional at least two shell process.

Subsequently, a method for manufacturing QDs according to the present disclosure is described in detail. For example, a method for manufacturing the QDs 100, 100', 100" as shown in FIG. 1 is described.

First, the core 10 is formed. The core 10 may be formed by a wet process that puts precursor materials in an organic solvent to grow particles. The same is the case with reaction of Zn precursor, Se precursor and Te precursor in a solution.

The Zn precursor may include Zn stearate. Besides, in preparing the Zn precursor, Zn metal powder, ZnO, Zn chloride and Zn acetate may be included. The Se precursor may be Se powder or a Se stock solution prepared by dissolving Se powder. The Te precursor may be a Te stock solution prepared by dissolving Te powder.

In this instance, a ratio of Se:Te is adjusted such that the Se:Te ratio in the completed core 10 is 1:10 to 100:1. The wet process may use, for example, a heat-up or hot injection method. Preferably, the hot-injection method may be performed as below.

First, a blend solution of Zn precursor and a solvent is prepared and heated. The solvent may be 1-octadecene (ODE). The solvent may include at least one of fatty acid such as oleic acid (OA) and palmitic acid (PA), and alkylamine such as oleylamine (OLA) and trioctylamine (TOA), or their combination.

The Se stock solution including Se precursor is injected into the blend solution. Subsequently, the Te stock solution including Te precursor is injected into the blend solution. Because the precursors in heated state are injected to cause a reaction, it is called hot-injection.

The Se stock solution may include the Se precursor and at least one of diphenylphosphine (DPP), trioctylphosphine (TOP), tributylphosphine (TBP) and tri-phenylphosphine (TPP). The Te stock solution may include the Te precursor and at least one of DPP, TOP, TBP and TPP.

The size of the core 10 may be adjusted by the reaction temperature and time. In the case of manufacturing the QD 100, after cooling down the temperature of the solution in which the core 10 is grown, purification and drying may be performed. In the case of manufacturing the QD 100', 100", the step of forming at least two shells is performed using, per se, the solution in which the core 10 is grown. The growth of the core 10 and the shell process are continuously performed.

The step of forming at least two shells on the core 10 is preferably performed to form a continuous shell by continuously injecting the shell forming materials into the solution in which the core 10 is formed by the reaction of the Zn precursor, the Se precursor and the Te precursor.

Each of the at least two shells may have a composition of a combination of a cation selected from Zn, Mg and their combination and an anion selected from S, Se and their combination. The shell forming materials that can provide the cation and the anion may be injected.

For example, when forming the ZnSeS shell, the Zn stock solution, the Se stock solution and the S stock solution may be injected step by step. When forming the ZnS shell, the Zn stock solution and the sulfur precursor may be injected.

Defects may be present on the surface of the core 10, and they act as a non-radiative relaxation site, resulting in low quantum efficiency. The at least two shells cap the surface defects of the ZnSeTe core, achieving improved quantum efficiency and narrow FWHM. The proposed continuous shell can synthesize QDs with high efficiency by a very simple method.

After the step of forming the shell, the method may further include the treatment step using a Zn stock solution for QD surface defect removal and additional ligand adsorption reaction. The Zn stock solution used may be different from the Zn stock solution used to form the shell. For example, the Zn stock solution in the treatment step may be a Zn/DDT stock solution prepared by dissolving Zn chloride in 1-dodecanethiol (DDT). Of course, Zn chloride may be replaced with Zn iodide and Zn bromide, and DDT may be replaced with octanethiol (OTT). The treatment step performed after QD reaction is a process for improving the efficiency and stability of the QDs through additional ligand adsorption.

The QDs may be used in QD light emitting diodes (QLEDs).

Figure 2:
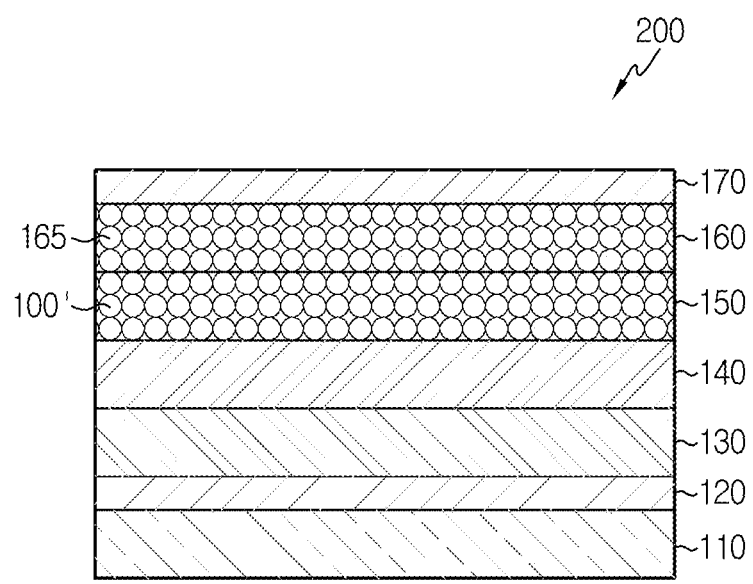
FIG. 2 is a cross-sectional view of a QD light emitting diode (QLED) according to the present disclosure.

FIG. 2 is a cross-sectional view of a QLED according to the present disclosure. For example, the QLED including the QDs 100' shown in (b) of FIG. 1 is described.

The QLED 200 of the present disclosure includes a hole transport layer (HTL) 140, a QD light emitting layer (EML) 150 and an electron transport layer (ETL) 160. The QD EML 150 is a layer that emits light by combining holes and electrons entering each of the HTL 140 and the ETL 160. This multilayer structure may be formed on a substrate 110 that serves as a mechanical support, and may further include an anode 120 for hole injection, a cathode 170 for electron injection, and a hole injection layer (HIL) 130 between the anode 120 and the HTL 140.

The substrate 110 may be a transparent and surface flat glass substrate or transparent plastic substrate. The substrate 110 may be used after contaminants removal by ultrasonic cleaning with a solvent, for example, isopropylalcohol (IPA), acetone and methanol, and UV-ozone treatment.

The anode 120 and the cathode 170 include metal, and are made of inorganics of metal oxide or other non-oxide that is suitable for each transparent/opaque condition. For bottom lighting, the anode 120 may be made of a transparent conductive metal such as transparent ITO, IZO, ITZO and AZO, and the cathode 170 may use metal having a small work function, namely, I, Ca, Ba, Ca/Al, LiF/Ca, LiF/Al, $BaF_2$/Al, $BaF_2$/Ca/Al, Al, Mg, Ag:Mg alloy, to facilitate the electron injection.

The HIL 130 and the HTL 140 serve to facilitate the hole injection from the anode 120, and transport holes to the QD EML 150. To form them, organics or inorganics are available, and may include any one selected from poly(ethylenedioxythiophene):polystyrene sulphonate (PEDOT:PSS), poly[(9, 9-dioctyl-fluorenyl-2, 7-diyl)-co-(4, 4'-(N-(p-butylphenyl))diphenyaline)] (TFB), poly(9-vinlycarbazole) (PVK), N, N, N', N'-tetrakis(4-methoxyphenyl)-benzidine (TPD), poly-TPD, 4, 4', 4"-tris(N-carbazolyl)-triphenylamine (TCTA), N, N'-bis(naphthalen-1-yl)-N, N'bis (phenyl)-9, 9-spiro-bifluorene(spiro-NPB), dipyrazino[2, 3-f:2', 3'-h]quinoxaline-2, 3, 6, 7, 10, 11-hexacarbonitrile (HATCN), 1, 1-bis[(di-4-tolylamino)phenylcyclohexane (TAPC), p-type metal oxide and their combination. The p-type metal oxide may be, for example, NiO, $MoO_3$, $WO_3$. According to a preferred embodiment, the HTL 140 is organics. In a specific example, the HIL 130 is PEDOT:PSS, and the HTL 140 is PVK or TFB.

The QD EML 150 is a layer formed by filling with the QDs 100' according to the present disclosure, and here, the QD EML 150 may be formed, for example, by coating on the HTL 140 by a solution process that coats a dispersion containing the QDs 100' in a solvent and volatilizing the solvent. The coating method may use, for example, drop casting, spin coating, dip coating, spray coating, flow coating, screen printing or inkjet printing, singly or in combination.

As described above, the QDs 100' exhibit visible light of desired wavelength by adjusting the Se:Te ratio in the core 10. The core 10 may be synthesized primarily by a wet process that puts precursor materials in an organic solvent to grow particles. It is possible to obtain light of various wavelength ranges through the adjustment of the energy band gap according to the extent of particle growth. The manufacturing method of the QDs will be described in detail below.

The ETL 160 serves to facilitate the electron injection from the cathode 170, and transport electrons to the QD EML 150. The ETL 160 includes metal oxide nanoparticles 165. For example, the ETL 160 may be formed by coating on the QD EML 150 by a solution process that coats a dispersion containing the metal oxide nanoparticles 165 in a solvent and volatilizing the solvent.

The metal oxide nanoparticles 165 may include Zn containing Mg oxide nanoparticles of $Zn_{1-x}Mg_xO(0 \leq x \leq 0.5)$ composition; and a Mg ion surface treatment layer formed on the nanoparticles surface. The Mg ion surface treatment layer may reduce a charge imbalance phenomenon. It is possible to achieve balanced injection of electrons and holes into the QD EML 150, thereby improving the performance of the QLED 200, in particular, luminance and efficiency.

When the QDs 100' emit blue, the QLED 200 may be applied as a blue excitation light source of a color-conversion device. For example, color-conversion of green and red InP QDs using the QLED as a blue excitation light source makes it possible to manufacture self-emitting display devices exhibiting blue, green and red.

Hereinafter, the present disclosure will be described in more detail by a detailed description of experimental example of the present disclosure.

Manufacture of Red Emitting ZnSeTe Core 1 mmol of Te is dissolved in 5 mL of TOP to prepare a Te/TOP stock solution.

4 mmol of Se is dissolved in 2 mL of DPP to prepare a Se/DPP stock solution.

2 mmol of Zn acetate, 2 mL of OA and 15 mL of ODE are put into a reactor, and a blend solution is heated in vacuum at 120° C. for 1 hour. Subsequently, after replacing the atmosphere in the reactor with nitrogen, the temperature is increased to 240° C. 0.25 mL of Se/DPP stock solution is injected into the blend solution, and then immediately, 5 mL of Te/TOP stock solution is injected into the blend solution, which is left alone for 1 hour to cause a reaction.

Manufacture of Green Emitting ZnSeTe Core 1 mmol of Te is dissolved in 5 mL of TOP to prepare a Te/TOP stock solution.

4 mmol of Se is dissolved in 2 mL of DPP to prepare a Se/DPP stock solution.

2 mmol of Zn acetate, 2 mL of OA and 15 mL of ODE are put into a reactor, and a blend solution is heated in vacuum at 120° C. 1 hour. Subsequently, after replacing the atmosphere in the reactor with nitrogen, the temperature is increased to 260° C. 0.5 mL of Se/DPP stock solution is injected into the blend solution, and then immediately, 1 mL of Te/TOP stock solution is injected into the blend solution, which is left alone for 1 hour to cause a reaction.

Manufacture of Blue Emitting ZnSeTe Core 1 mmol of Te is dissolved in 5 mL of TOP to prepare a Te/TOP stock solution.

4 mmol of Se is dissolved in 2 mL of DPP to prepare a Se/DPP stock solution.

2 mmol of Zn acetate, 2 mL of OA and 15 mL of ODE are put into a reactor, and a blend solution is heated in vacuum at 120° C. for 1 hour. Subsequently, after replacing the atmosphere in the reactor with nitrogen, the temperature is increased to 300° C. 0.5 mL of Se/DPP stock solution is injected into the blend solution, and then immediately, 0.1 mL of Te/TOP stock solution is injected into the blend solution, which is left alone for 1 hour to cause a reaction.

Formation of ZnSe/ZnSeS/ZnS/ZnS Continuous Quadruple-Shell

ZnSe/ZnSeS/ZnS/ZnS shell/shell/shell/shell is continuously formed in the previously prepared red, green and blue emitting ZnSeTe core solutions, and shell reactions are performed while maintaining the temperatures of 240, 260 and 300° C. in an order of red, green and blue emitting ZnSeTe cores.

3.6 mmol of Zn acetate is dissolved in a blend solution of 6 mL of OA and 3 mL of ODE to prepare a Zn acetate stock solution.

2.4 mmol of Zn stearate is dissolved in 6 mL of ODE to prepare a Zn stearate stock solution.

2.4 mmol of S is dissolved in 2 mL of TOP to prepare a S/TOP stock solution.

2.4 mmol of Se is dissolved in 2 mL of TOP to prepare a Se/TOP stock solution.

4 mmol of Zn chloride is dissolved in 4 mL of DDT to prepare a Zn/DDT stock solution.

3 mL of Zn acetate stock solution and 1 mL of Se/TOP stock solution are continuously injected into the previously prepared red, green and blue emitting ZnSeTe core solutions, and left alone at 240, 260 and 300° C. for 30 minute to cause a reaction. 3 mL of Zn acetate stock solution, 0.5 mL of Se/TOP stock solution and 0.5 mL of S/TOP stock solution are continuously injected, and subjected to reaction at 240, 260 and 300° C. for 30 minutes. Subsequently, 3 mL of Zn acetate stock solution and 1 mL of S/TOP stock solution are injected, and subjected to reaction at 240, 260 and 300° C. for 30 minutes. The three shell stock solutions are continuously injected to form a ZnSe/ZnSeS/ZnS shell.

Subsequently, 3 mL of Zn stearate stock solution is injected, and subjected to reaction at 240, 260 and 300° C. for 30 minutes. Subsequently, 3 mL of Zn stearate stock solution is injected once more, and subjected to reaction at 240, 260, 300° C. for 30 minutes. Finally, 1 mL of OTT is injected and subjected to reaction at 240, 260, 300° C. for 30 minutes to form a ZnS outermost shell.

Subsequently, the core/shell/shell/shell/shell solution, in which the ZnSeTe/ZnSe/ZnSeS/ZnS/ZnS continuous shell quickly cooled at room temperature is formed, is increased to 40° C., and 4 mL of Zn/DDT stock solution is injected and subjected to reaction at 40° C. for 2 hours, completing the surface treatment by ZnSeTe/ZnSe/ZnSeS/ZnS/ZnS QDs surface defect removal and additional ligand adsorption reaction.

After the reactions are all finished, the reaction solution is cooled at room temperature, and dispersed in hexane by centrifugal separation using acetone and ethanol for use in analysis and device manufacture.

Formation of ZnSe/ZnSeS/ZnS/MgS Continuous Quadruple-Shell 3.6 mmol of Zn acetate is dissolved in a blend solution of 6 mL of OA and 3 mL of ODE to prepare a Zn acetate stock solution.

2.4 mmol of Mg stearate is dissolved in 6 mL of ODE to prepare a Mg stearate stock solution.

2.4 mmol of S is dissolved in 2 mL of TOP to prepare a S/TOP stock solution.

2.4 mmol of Se is dissolved in 2 mL of TOP to prepare a Se/TOP stock solution.

4 mmol of Zn chloride is dissolved in 4 mL of DDT to prepare a Zn/DDT stock solution.

3 mL of Zn acetate stock solution and 1 mL of Se/TOP stock solution are continuously injected into the previously prepared green emitting ZnSeTe core solution, and left alone at 260° C. for 30 minutes to cause a reaction. 3 mL of Zn acetate stock solution, 0.5 mL of Se/TOP stock solution and 0.5 mL of S/TOP stock solution are continuously injected, and subjected to reaction at 260° C. for 30 minutes. Subsequently, 3 mL of Zn acetate stock solution and 1 mL of S/TOP stock solution are injected, and subjected to reaction at 260° C. for 30 minutes. The three shell stock solutions are continuously injected to form a ZnSe/ZnSeS/ZnS shell.

Subsequently, 3 mL of Mg stearate stock solution is injected, and subjected to reaction at 260° C. for 30 minutes. Subsequently, 3 mL of Mg stearate stock solution is injected once more, and subjected to reaction at 260° C. for 30 minutes. Finally, 1 mL of OTT is injected and subjected to reaction at 260° C. for 30 minutes to form a MgS outermost shell.

Subsequently, the core/shell/shell/shell/shell solution, in which the ZnSeTe/ZnSe/ZnSeS/ZnS/MgS continuous shell quickly cooled at room temperature is formed, is increased to 40° C., and 4 mL of the Zn/DDT stock solution is injected and subjected to reaction at 40° C. for 2 hours, completing the surface treatment by ZnSeTe/ZnSe/ZnSeS/ZnS/MgS QDs surface defect removal and additional ligand adsorption reaction.

After the reactions are all finished, the reaction solution is cooled at room temperature, and dispersed in hexane by centrifugal separation using acetone and ethanol for use in analysis and device manufacture.

Formation of ZnMgO Nanoparticles (NP)

ZnMgO nanoparticles are synthesized through a solution-precipitation chemical method.

A transparent solution containing 10 mmol of tetramethylammoniumhydroxide (TMAH) and 10 mL of ethanol is slowly added to a cation solution containing 8.5 mmol of Zn acetate dihydrate and 1.5 mmol of Mg acetate tetrahydrate dissolved in 30 mL of dimethyl sulfoxide (DMSO) at room temperature, and is maintained for 1 hour while maintaining the temperature. The synthesized ZnMgO nanoparticles are subjected to precipitation with an excess of acetone and re-dispersed in ethanol for electron transport layer (hereinafter, ETL) spin coating.

Manufacture of QLED

A blue and green electroluminescent device including an emitter of a single QD manufactured above is manufactured. The lamination order is ITO/PEDOT:PSS HIL/PVK HTL/ZnSeTe/ZnSe/ZnSeS/ZnS/ZnS QD EML/ZnMgO NP ETL/Al.

First, a glass substrate having a patterned ITO anode is washed with each of distilled water, acetone and isopropanol, and treated with UV-ozone for 20 minutes. Poly(ethylenedioxythiophene):polystyrene sulphonate (PEDOT:PSS) (AI 4083) is spin coated at 3000rpm for 60 seconds and baked in 150° C. N2 atmosphere for 30 minutes to form a HIL. A solution of 0.05 g of PVK (average MW=25000-50000) in 5 mL of chlorobenzene is spin coated on the HIL at 3000 rpm for 60 seconds to form a HTL.

A dispersion of blue ZnSeTe/ZnSe/ZnSeS/ZnS/ZnS QDs adjusted to have the optical density of 2.7 at 420 nm or green ZnSeTe/ZnSe/ZnSeS/ZnS/ZnS QDs adjusted to have the optical density of 2.0 at 450 nm in hexane is spin coated on the HTL at 2000 rpm for 20 seconds and dried at room temperature. After a QD EML is formed, a dispersion of ZnMgO nanoparticles in ethanol (concentration 28-30 mg/mL) is spin coated at 3000 rpm for 30 seconds to form a ZnMgO NP ETL.

Finally, a 100 nm thick Al cathode is formed by a thermal evaporation method through a linear metal mask, completing the manufacture of the device.

Evaluation:

UV-Vis absorption and PL spectra of QDs are recorded using absorption spectroscopy (Shimadzu, UV-2450) and a 500 W xenon lamp-equipped spectrophotometer (PSI Inc., Darsa Pro-5200) respectively. The absolute PL quantum yield of diluted QD dispersion is evaluated using a PL QY measurement system (C9920-02, Hamamatsu). The structure and alloy properties of QDs are interpreted by using powder X-ray diffraction (XRD) (Rigaku, Ultima IV) using Cu Kα radiation. To obtain a QD image, TEM operation is performed using JEOL JEM-F200 that operates at 200 kV. Additionally, for evaluation of the properties of the electroluminescent device as a function of voltage, spectroradiometer (Konica Minolta, CS-2000) and sourcemeter (Keithley Instruments, Keithley 2400) are used.

Figure 3:
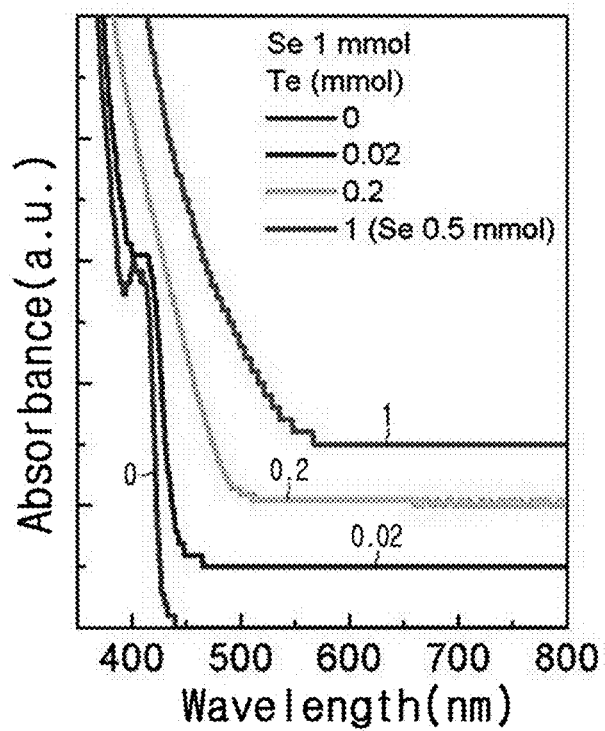
FIG. 3 shows, in an experimental example of the present disclosure, ultraviolet (UV) absorption spectra as a function of an amount of Te (0, 0.02, 0.2, 1 mmol) injected when forming a ZnSeTe core.
Figure 4:
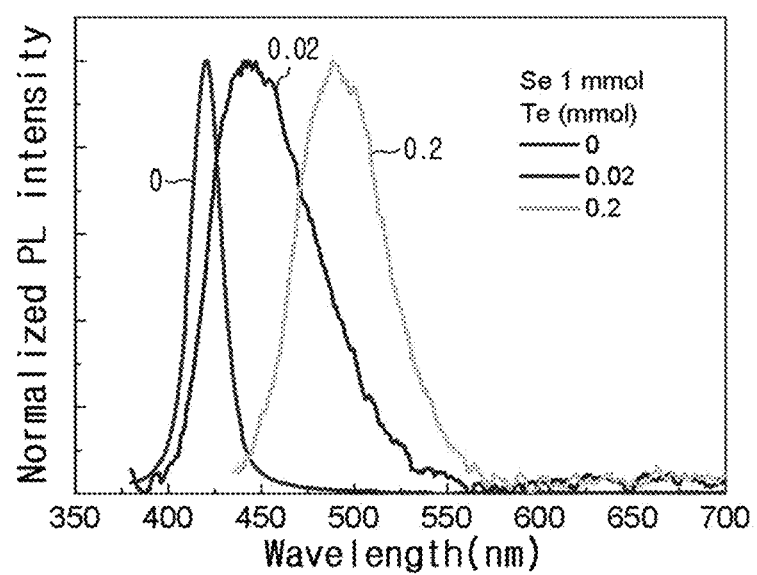
FIG. 4 shows, in an experimental example of the present disclosure, photoluminescence (PL) spectra as a function of an amount of Te (0, 0.02, 0.2 mmol) injected when forming a ZnSeTe core.

Results:

To investigate a change in emission wavelength with a change in Se:Te ratio in the ZnSeTe core synthesis, an amount of injected Se is fixed to 1 mmol while changing an amount of injected Te to 0, 0.02 and 0.2 mmol, and in a ZnSeTe core synthesized by injecting an amount of Se of 0.5 mmol and an amount of Te of 1 mmol, a change in UV absorption spectra with a change in Se:Te ratio is shown in FIG. 3, and a change in PL spectra is shown in FIG. 4. The results are shown in Table 1, and it is found that the emission center wavelength of the obtained ZnSeTe QDs changes to 421-489 nm with the increasing amount of injected Te.

TABLE 1

| Te (mmol) | Center Wavelength (nm) | FWHM (nm) |
|---|---|---|
| 0 | 421 | 20 |
| 0.02 | 441 | 68 |
| 0.2 | 489 | 55 |

When an amount of injected Te is 0, that is, when the core is ZnSe, the center wavelength is 421 nm, showing violet emission, and when an amount of injected Te is 0.02 mmol, the center wavelength is 441 nm, showing almost blue emission. An amount of injected Te 0.02 mmol corresponds to a Se:Te ratio of 50:1 in the ZnSeTe core. As an amount of injected Te increases, the center wavelength is longer, and when an amount of injected Te is 0.2 mmol, the center wavelength increases to 489 nm, showing almost green emission. When an amount of injected Se is 0.5 mmol and an amount of injected Te is 1 mmol, light absorption starts at 550 nm, but PL spectra is not measured.

Figure 5:
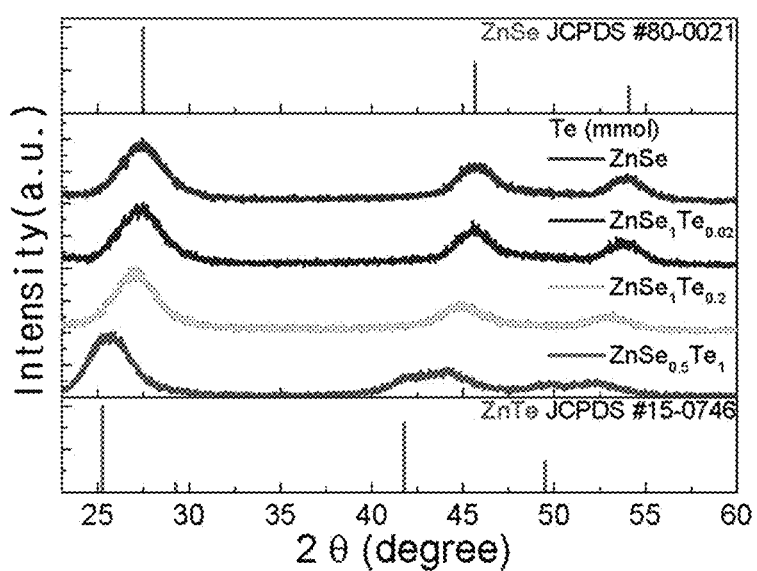
FIG. 5 shows, in an experimental example of the present disclosure, an X-ray diffraction (XRD) pattern as a function of an amount of Te (0, 0.02, 0.2, 1 mmol) injected when forming a ZnSeTe core.

FIG. 5 shows the XRD pattern as a function of an amount of Te injected when forming the core, showing the structure and alloying results of QDs through X-ray diffraction. It can be seen that all ZnSeTe QDs equally have the typical zinc-blende structure although it is somewhat difficult evaluate the crystal structure accurately due to the small ZnSeTe core and the broad reflection peak. It can be seen that because the amount of Te is small, most of diffraction patterns are close to the ZnSe phase, but with the increasing amount of injected Te, the reflection peak of the ZnSeTe core moves closer to the ZnTe phase.

Figure 6:
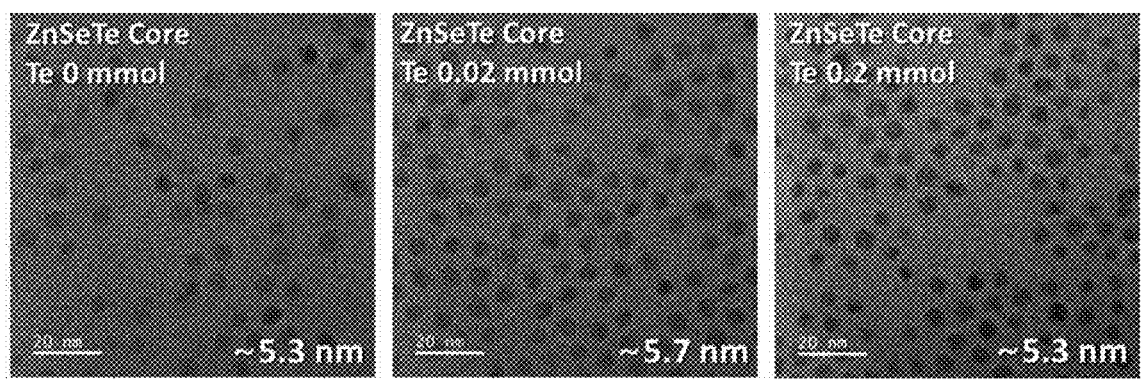
FIG. 6 shows, in an experimental example of the present disclosure, a transmission electron microscopy (TEM) image as a function of an amount of Te (0, 0.02, 0.2 mmol) injected when forming a ZnSeTe core.

FIG. 6 shows, in an experimental example of the present disclosure, a TEM image as a function of an amount of Te (0, 0.02, 0.2 mmol) injected when forming the ZnSeTe core. At an amount of injected Te changing to 0, 0.02, 0.2 mmol, the size of the core is measured as 5.3 nm, 5.7 nm and 5.3 nm. Through the TEM image analysis, it can be seen that the ZnSeTe QDs have a core and is 5-6 nm in size, and the size of the ZnSeTe core is constant irrespective of an amount of injected Te. This identifies that a change in QD center wavelength occurs due to a composition change of the ZnSeTe QDs irrespective of the QD size.

Figure 7:
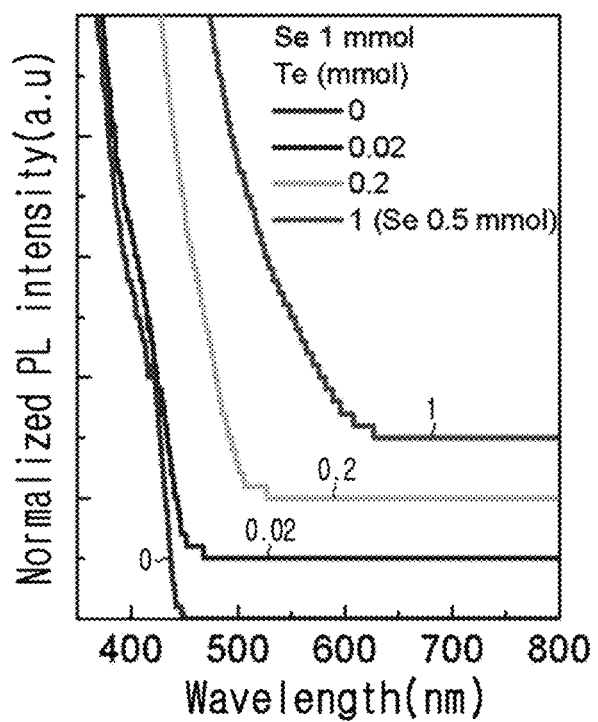
FIG. 7 shows, in an experimental example of the present disclosure, UV absorption spectra as a function of an amount of Te (0, 0.02, 0.2, 1 mmol) injected when forming ZnSeTe/ZnSe/ZnSeS/ZnS/ZnS core/shell/shell/shell/shell QDs.
Figure 8:
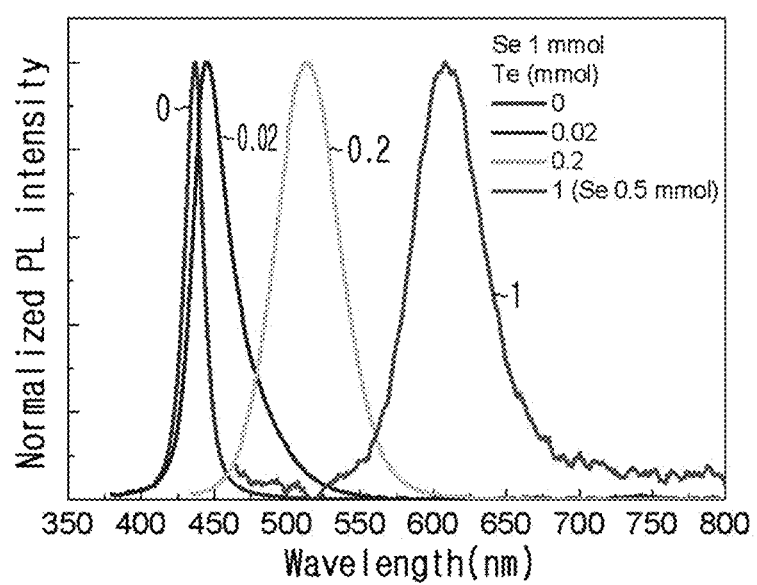
FIG. 8 shows, in an experimental example of the present disclosure, PL spectra as a function of an amount of Te (0, 0.02, 0.2, 1 mmol) injected when forming ZnSeTe/ZnSe/ZnSeS/ZnS/ZnS QDs.

When an amount of injected Se of the ZnSeTe core is fixed to 1 mmol, an amount of injected Te changes to 0, 0.02 and 0.2 mmol, an amount of injected Se is 0.5 mmol and an amount of injected Te is 1 mmol, absorption spectra of the ZnSeTe/ZnSe/ZnSeS/ZnS/ZnS core/shell/shell/shell/shell QDs manufactured by performing the ZnSe/ZnSeS/ZnS/ZnS continuous shell process on the formed ZnSeTe core is shown in FIG. 7, and PL spectra is shown in FIG. 8. Table 2 shows the results, and when the continuous shell process is performed, a red shift is observed in comparison to the center wavelength of the ZnSeTe core.

TABLE 2

| | ZnSeTe core | | ZnSeTe/ZnSe/ZnSeS/ZnS/ZnS core/shell/shell/shell/shell | | |
|---|---|---|---|---|---|
| Te (mmol) | Center Wavelength (nm) | FWHM (nm) | Center Wavelength (nm) | FWHM (nm) | Quantum efficiency (%) |
| 0 | 421 | 20 | 437 | 15 | 81 |
| 0.02 | 441 | 68 | 445 | 32 | 82 |
| 0.2 | 489 | 55 | 513 | 51 | 84 |
| 1 (Se 0.5 mmol) | — | — | 608 | 58 | 10 |

Because the ZnSeTe/ZnSe/ZnSeS/ZnS/ZnS QDs contain ZnSe in common between the shell of ZnSe/ZnSeS/ZnS composition and the core of ZnSeTe composition, electrons of the exciton in the core easily leak to the shell, and the photon confinement effect of the exciton reduces, and thus, the band gap of the QDs decreases and the red shift occurs. Additionally, when an amount of injected Te of the ZnSeTe/ZnSe/ZnSeS/ZnS/ZnS QDs made by performing the continuous shell process is 0.02 mmol, good emission properties of quantum efficiency of 82% and FWHM of 32 nm are exhibited at 445 nm blue emission wavelength, and when an amount of injected Te is 0.2 mmol, good emission properties of quantum efficiency of 84% and FWHM of 51 nm are exhibited at 513 nm green emission wavelength. In the case of the ZnSeTe/ZnSe/ZnSeS/ZnS/ZnS QDs with an amount of injected Se of 0.5 mmol and an amount of injected Te of 1 mmol at the Se:Te composition of 1:2 in the core, the emission properties of quantum efficiency of 10% and FWHM of 58 nm are exhibited at 608 nm red emission wavelength, showing the possibility of red emitting QDs using ZnSeTe QDs.

Figure 9:
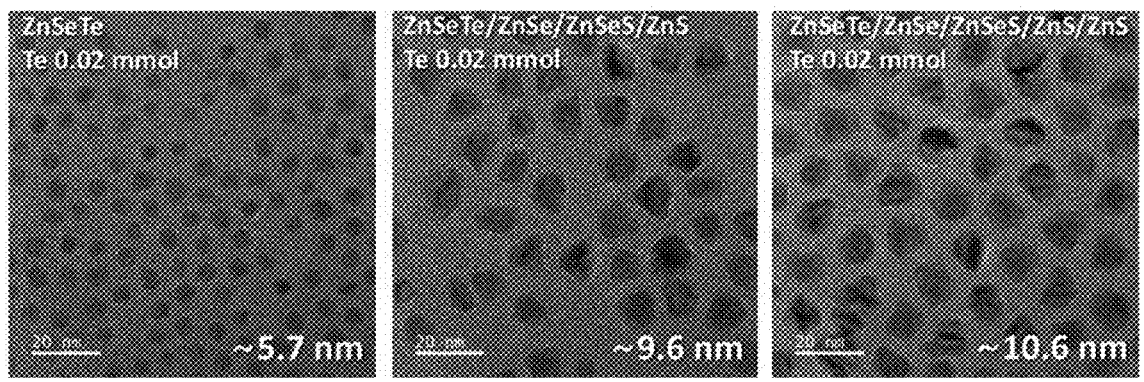
FIG. 9 shows, in an experimental example of the present disclosure, a TEM image in the progress of a shell process when forming ZnSeTe/ZnSe/ZnSeS/ZnS/ZnS QDs.

FIG. 9 is a TEM image of a size change in the progress of the shell process of the synthesized ZnSeTe core is performed. When an amount of injected Te is fixed to 0.02 mmol, the ZnSeTe core, the ZnSeTe/ZnSe/ZnSeS/ZnS QDs, the ZnSeTe/ZnSe/ZnSeS/ZnS/ZnS QDs are measured as 5.7 nm, 9.6 nm and 10.6 nm in size. Through TEM image analysis, it is found that the QD size increases in the progress of the shell process, and through this, the shell is formed by the continuous shell process of the synthesis method.

Figure 10:
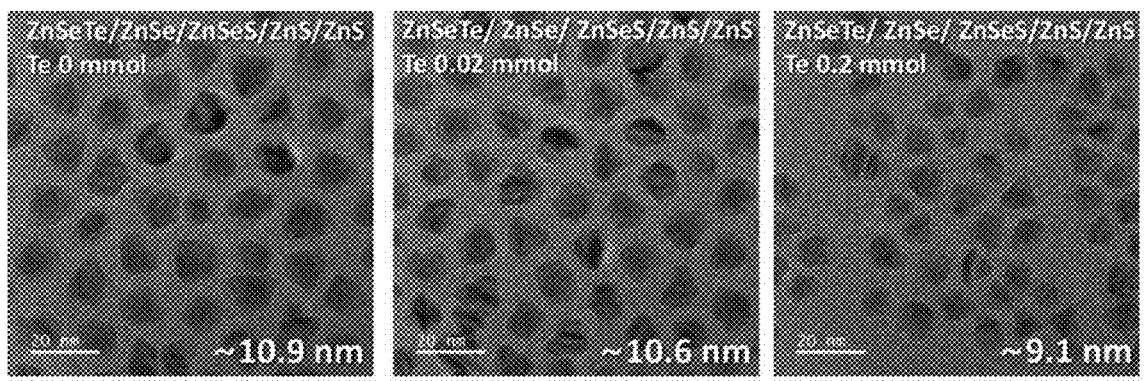
FIG. 10 shows, in an experimental example of the present disclosure, a TEM image as a function of an amount of Te (0, 0.02, 0.2 mmol) injected when forming ZnSeTe/ZnSe/ZnSeS/ZnS/ZnS QDs.

FIG. 10 is a TEM image of the synthesized ZnSeTe/ZnSe/ZnSeS/ZnS/ZnS QDs. The QD size is measured as 10.9 nm, 10.6 nm and 9.1 nm at an amount of injected Te changing to 0, 0.02 and 0.2 mmol. Through the TEM image analysis, it is found that the shell is formed by the continuous shell process irrespective of the composition of the Se:Te ratio in the ZnSeTe core, and the ZnSeTe/ZnSe/ZnSeS/ZnS/ZnS QDs are formed about 9-11 nm in size that is larger than the core size.

Figure 11:
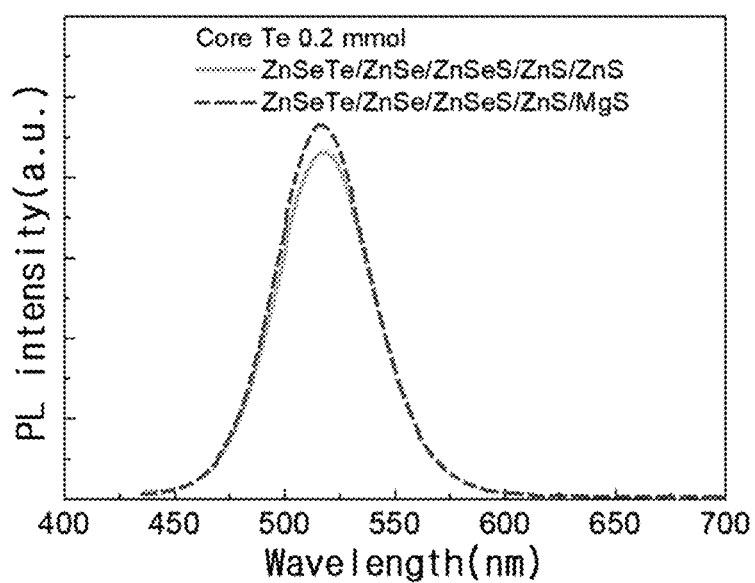
FIG. 11 shows, in an experimental example of the present disclosure, a comparison of PL spectra between ZnSeTe/ZnSe/ZnSeS/ZnS/ZnS QDs and ZnSeTe/ZnSe/ZnSeS/ZnS/MgS QDs.

FIG. 11 shows a PL spectra change as a function of shell composition for ZnSeTe/ZnSe/ZnSeS/ZnS/ZnS QDs and the ZnSeTe/ZnSe/ZnSeS/ZnS/MgS QDs synthesized by performing a two different continuous shell process on a green emitting core with an amount of injected Te fixed to 0.2 mmol.

In the case of the MgS shell composition, the lattice constants of the ZnSe composition and the MgS composition are very similar, and the band gap of the MgS composition is larger than the band gap of the ZnS composition, and thus an advantage is stable confinement of electrons of the core, and as a result, PL QY increases from 82% to 87%.

Figure 12:
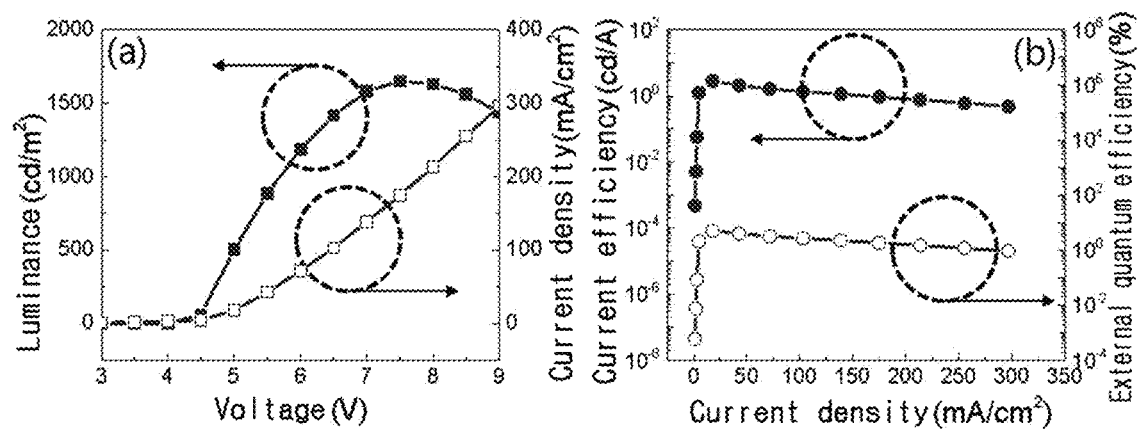
FIG. 12 is a graph showing, in an experimental example of the present disclosure, (a) a change in current density-luminance as a function of voltage, and (b) a change in current efficiency-external quantum efficiency as a function of current density, for a blue QLED.

FIG. 12 shows device properties of a QLED manufactured using blue emitting ZnSeTe/ZnSe/ZnSeS/ZnS/ZnS core/shell/shell/shell/shell QDs with an amount of injected Te of 0.02 mmol, and referring to (a) of FIG. 12, the blue QLED according to the present disclosure has the maximum luminance of 1652 cd/m$^2$ obtained at the operating voltage of 7.5 V (current density 175 mA/cm$^2$). As shown in (b) of FIG. 12, the maximum current efficiency and the maximum external quantum efficiency are 2.8 cd/A and 5.1%, respectively.

Figure 13:
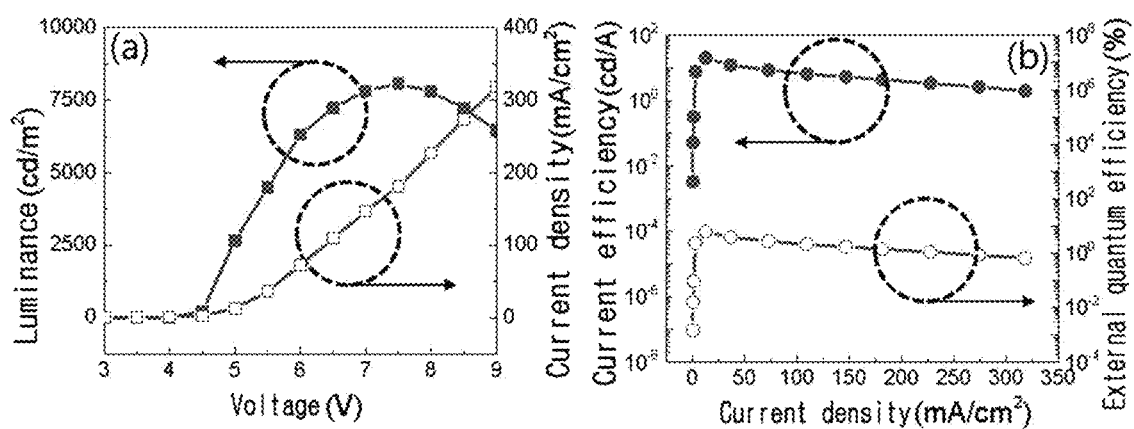
FIG. 13 is a graph showing, in an experimental example of the present disclosure, (a) a change in current density-luminance as a function of voltage, and (b) a change in current efficiency-external quantum efficiency as a function of current density, for a green QLED.

FIG. 13 shows device properties of a QLED manufactured using green emitting ZnSeTe/ZnSe/ZnSeS/ZnS/ZnS core/shell/shell/shell/shell QDs with an amount of injected Te of 0.2 mmol, and referring to (a) of FIG. 13, the green QLED according to the present disclosure has the maximum luminance of 8067 cd/m$^2$ obtained at the operating voltage of 7.5 V (current density 182 mA/cm$^2$). As shown in (b) of FIG. 13, the maximum current efficiency and the maximum external quantum efficiency are 20.4 cd/A and 6.2%, respectively.

This work was supported by the National Research Foundation of Korea (NRF) grant funded by Ministry of Science, ICT & Future Planning (MSIP) (No. 2017R1A2B3008628, No. 2018M3D1A1058536) and Basic Science Research Program through the NRF funded by Ministry of Education (No. 2015R1A6A1A03031833).

While the preferred embodiments of the present disclosure have been hereinabove illustrated and described, the present disclosure is not limited to the specific preferred embodiments described above, and it is obvious to those having ordinary skill in the technical field pertaining to the present disclosure that various modifications can be made thereto without departing from the key subject matter of the present disclosure set forth in the appended claims, and such modifications fall within the scope of the appended claims.

What is claimed is:

1. Quantum dots comprising a II-VI based ternary ZnSeTe core, and at least two shells,
   wherein a Se:Te ratio in the ZnSeTe core is 1:10 to 100:1,
   wherein each of the at least two shells has a composition of a combination of a cation selected from Zn, Mg and their combination and an anion selected from S, Se and their combination, and
   wherein the at least two shells are a triple-shell including an inner shell surrounding the core, an intermediate shell surrounding the inner shell and an outermost shell surrounding the intermediate shell, or a quadruple-shell in which at least one of the inner shell, the intermediate shell and the outermost shell is double, and the triple-shell is ZnSe/ZnSe$_x$S$_{1-x}$(0<x<1)/MgS, and the quadruple-shell is ZnSe/ZnSe$_x$S$_{1-x}$(0<x<1)/ZnS/ZnS or ZnSe/ZnSe$_x$S$_{1-x}$(0<x<1)/ZnS/MgS.

2. The quantum dots according to claim 1, wherein the Se:Te ratio in the ZnSeTe core is 1:10 to 1:1 and the quantum dots emit red light.

3. The quantum dots according to claim 1, wherein the Se:Te ratio in the ZnSeTe core is 1:1 to 10:1 and the quantum dots emit green light.

4. The quantum dots according to claim 1, wherein the Se:Te ratio in the ZnSeTe core is 10:1 to 100:1 and the quantum dots emit blue light.

5. A quantum dot light emitting diode, comprising a hole transport layer, a quantum dot light emitting layer and an electron transport layer, wherein the quantum dot light emitting layer includes the quantum dots according to claim 1.

6. A quantum dot light emitting diode, comprising a hole transport layer, a quantum dot light emitting layer and an electron transport layer, wherein the quantum dot light emitting layer includes the quantum dots according to claim 2.

7. A quantum dot light emitting diode, comprising a hole transport layer, a quantum dot light emitting layer and an electron transport layer, wherein the quantum dot light emitting layer includes the quantum dots according to claim 3.

8. A quantum dot light emitting diode, comprising a hole transport layer, a quantum dot light emitting layer and an electron transport layer, wherein the quantum dot light emitting layer includes the quantum dots according to claim 4.

9. The quantum dot light emitting diode according to claim 5, further comprising:
   an anode,
   a hole injection layer, and
   a cathode,
   wherein the hole transport layer and the hole injection layer are any one selected from poly(ethylenedioxythiophene):polystyrene sulphonate (PEDOT:PSS), poly[(9, 9-dioctyl-fluorenyl-2, 7-diyl)-co-(4, 4'-(N-(p-butylphenyl))diphenylamine)] (TFB), poly(9-vinlycarbazole) (PVK), N, N, N', N'-tetrakis(4-methoxyphenyl)-benzidine (TPD), poly-TPD, 4, 4', 4"-tris(N-carbazolyl)-triphenylamine (TCTA), N, N'-bis(naphthalen-1-yl)-N, N'bis(phenyl)-9, 9-spiro-bifluorene(spiro-NPB), dipyrazino[2, 3-f:2', 3'-h]quinoxaline- 2, 3, 6, 7, 10, 11-hexacarbonitrile (HATCN), 1, 1-bis[(di-4-tolylamino)phenylcyclohexane (TAPC), p-type metal oxide and their combination.

10. The quantum dot light emitting diode according to claim 5, wherein the electron transport layer includes metal oxide nanoparticles, and the metal oxide nanoparticles include Zn containing Mg oxide nanoparticles of $Zn_{1-x}MgO$ ($0 \leq x \leq 0.5$) composition; and a Mg ion surface treatment layer formed on the nanoparticles surface.

11. A method for manufacturing quantum dots, comprising:
reacting a Zn precursor, a Se precursor and a Te precursor in a solution, and forming at least two shells on the ZnSeTe core,
wherein the quantum dots include a II-VI based ternary ZnSeTe core, and a Se:Te ratio in the ZnSeTe core is 1:10 to 100:1,
wherein each of the at least two shells has a composition of a combination of a cation selected from Zn, Mg and their combination and an anion selected from S, Se and their combination, and
wherein the at least two shells are a triple-shell including an inner shell surrounding the core, an intermediate shell surrounding the inner shell and an outermost shell surrounding the intermediate shell, or a quadruple-shell in which at least one of the inner shell, the intermediate shell and the outermost shell is double, and the triple-shell is $ZnSe/ZnSe_xS_{1-x}(0<x<1)/MgS$, and the quadruple-shell is $ZnSe/ZnSe_xS_{1-x}(0<x<1)/ZnS/ZnS$ or $ZnSe/ZnSe_xS_{1-x}(0<x<1)/ZnS/MgS$.

12. The method for manufacturing quantum dots according to claim 11, wherein reacting the Zn precursor, the Se precursor and the Te precursor comprises:
heating a blend solution of a Zn precursor and a solvent;
injecting a Se stock solution including a Se precursor into the blend solution; and
injecting a Te stock solution including a Te precursor into the blend solution.

13. The method for manufacturing quantum dots according to claim 11, wherein forming the at least two shells on the ZnSeTe core comprises continuously injecting the shell forming materials into the solution in which the reaction of the Zn precursor, the So precursor and the To precursor occurred to form a continuous shell.

* * * * *